(12) United States Patent
Chang

(10) Patent No.: US 7,187,561 B2
(45) Date of Patent: Mar. 6, 2007

(54) WIND FENDER FOR MAINBOARDS

(75) Inventor: Lin-Wei Chang, Taipei (TW)

(73) Assignee: Inventec Corporation, Taipei (TW)

( * ) Notice: Subject to any disclaimer, the term of this patent is extended or adjusted under 35 U.S.C. 154(b) by 49 days.

(21) Appl. No.: 11/122,053

(22) Filed: May 5, 2005

(65) Prior Publication Data
US 2006/0249295 A1 Nov. 9, 2006

(51) Int. Cl.
H05K 7/20 (2006.01)
H05K 7/14 (2006.01)

(52) U.S. Cl. ............... 361/826; 361/688; 361/683; 361/796

(58) Field of Classification Search ............ 361/679, 361/600, 796, 678, 687, 683, 688, 826, 752, 361/831
See application file for complete search history.

(56) References Cited

U.S. PATENT DOCUMENTS 5,813,243 A * 9/1998 Johnson et al. ............ 62/259.2
6,147,862 A * 11/2000 Ho ........................... 361/685
6,496,366 B1 * 12/2002 Coglitore et al. ........... 361/687
6,822,859 B2 * 11/2004 Coglitore et al. ........... 361/687
6,850,408 B1 * 2/2005 Coglitore et al. ........... 361/683
2003/0076652 A1 * 4/2003 Ahn ......................... 361/683
2003/0184961 A1 * 10/2003 Ahn ......................... 361/683

* cited by examiner

Primary Examiner—William H. Mayo
Assistant Examiner—Dameon E. Levi
(74) Attorney, Agent, or Firm—Rabin & Berdo, P.C.

(57) ABSTRACT

A wind fender to isolate heat sources of a mainboard and direct heat to air vents includes a plurality of notches on the wind fender to allow cables on the mainboard to pass through and confine the movement of the cables along the X axis. The wind fender further has retaining sections normal to the wind fender to prevent the cables from moving along the Y axis. Hence heat of the mainboard may be dispelled quickly and the cables may be laid according to a preset wiring layout to accelerate heat dissipation.

10 Claims, 4 Drawing Sheets

WIND FENDER FOR MAINBOARDS

FIELD OF THE INVENTION

The invention relates to a wind fender and particularly to a wind fender to confine the cable wiring layout on a mainboard.

BACKGROUND OF THE INVENTION

With the rapid advance of electronic technology, wide varieties of electronic devices have been developed and have become indispensable to people in their daily lives. As the popularity of electronic devices grows, users also have greater demands on their electronic devices, especially on the processing speed and size.

For instance, the execution speed of computer platforms has increased from 500 Mhz a few years ago to 2000 Mhz or more now. Notebook computers have become the mainstream because of their size advantage. On servers, the blade server has become the mainstream also because of its small size.

Refer to FIG. 1 for a case interior used in a conventional electronic device. It contains a mainboard 20 and a power supply 10, which provides electric power for the mainboard 20. The power supply 10 is connected to a power connector 22 of the mainboard 20 through a cable 12, which is coupled with a connector. The power supply 10 also provides the power needed for other peripheral devices (such as optical disk drives) through other cables.

Because the power supply 10 has to provide electric power to the electronic device for operation, it generates a great amount of heat. The heat is generally dispersed by an air fan 30 installed on the rear side of the power supply 10. The air fan generates cooling air to accelerate heat dispersion through air vents 40 to prevent the power supply 10 from overheating and being damaged.

As the location of the power supply 10 may be far from the air vents 40, the heat generated could be spread throughout the entire case, overheating the mainboard 20. The overheated condition affects processing speed of the electronic device and is not acceptable. To overcome the aforesaid problems, some manufacturers try to install a wind fender to confine and direct the cooling air generated by the air fan 30 to the air vents 40.

Refer to FIGS. 2A and 2B for a first and a second embodiment of the wind fender now being used to direct the cooling air.

Refer to FIG. 2A for a wind fender installed on a mainboard. The wind fender 50 is installed between an air fan 30 and air vents 40 to direct cooling air generated by the air fan 30 to the air vents 40 to dispel heat generated by the power supply 10 to outside the mainboard 20. As the power supply 10 requires a cable to transmit electric power to the mainboard 20 and other devices, a space is reserved between the wind fender 50 and the air fan 30 to allow the cable 12 and an audio wire 24 to pass through to connect to the mainboard 20 or other devices. The reserved space restricts the wiring layout of the cable 12 and the audio wire 24. Some cable 12 and audio wire 24 are made with a fixed length. The constraint mentioned above could make some devices beyond the reach of the cable 12 or audio wire 24, and result in some devices and speakers being unable to receive electric power from the power supply 10.

FIG. 2B illustrates an improved air fender proposed by some vendors to overcome the constraint of cable wiring previously discussed. A wind fender 60 has a notch 62 according a preset wiring layout of cables 12 and 24 (such as a power cord and an audio wire) of a power supply 10 so that the cables can pass through and be confined to desired locations to match the mainboard 20. However, the notch 62 can confine cable movements only in the X axis, but not in the Y axis. Some portion of the cables 12 or 24 escape the preset layout position and scatter on the mainboard 20. Such a situation affects cooling or assembly of the mainboard 20.

Hence in the present design that focuses on performance and size, how to disperse heat from inside of the case and lay the cables according to a selected layout to improve cooling and assembly of the mainboard are issues remaining to be resolved.

SUMMARY OF THE INVENTION

In view of the aforesaid problems, the invention aims to provide a wind fender to disperse main heat sources of the mainboard and confine the cables on the mainboard to selected locations.

The wind fender according to the invention includes anchor sections to anchor the wind fender on the mainboard, and a plurality of notches to enable the cables to pass through and restrict the movement of the cables along the X and Z axes. The wind fender further has a plurality of retaining sections vertically located thereon to prevent the cables passing through the notches from moving along the Y axis and straying from the preset wiring layout. The retaining sections are perpendicular to the wind fender to form a 90° angle therebetween.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
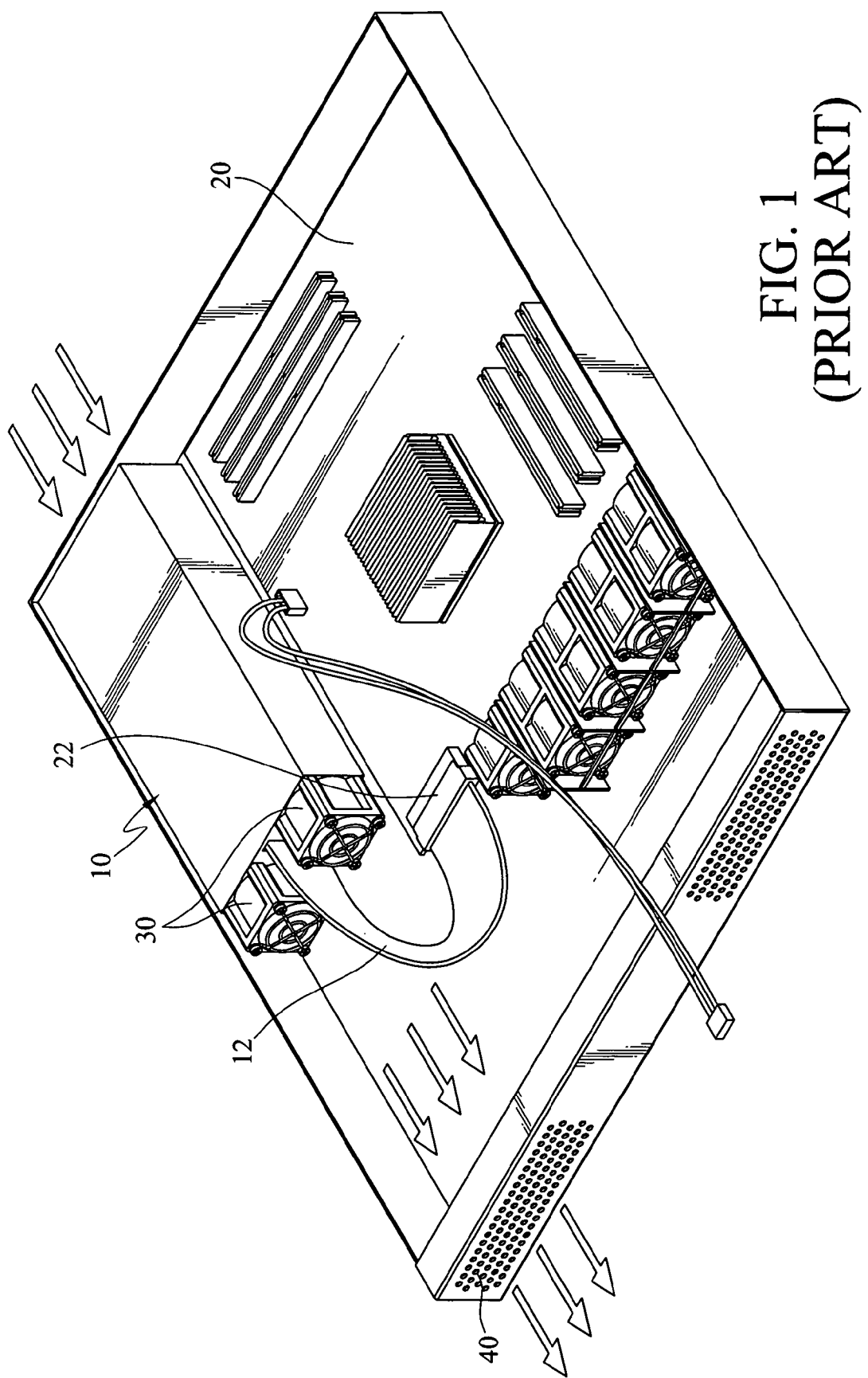
FIG. 1 is a schematic view of an interior layout of a case of a conventional electronic device.
Figure 2A:
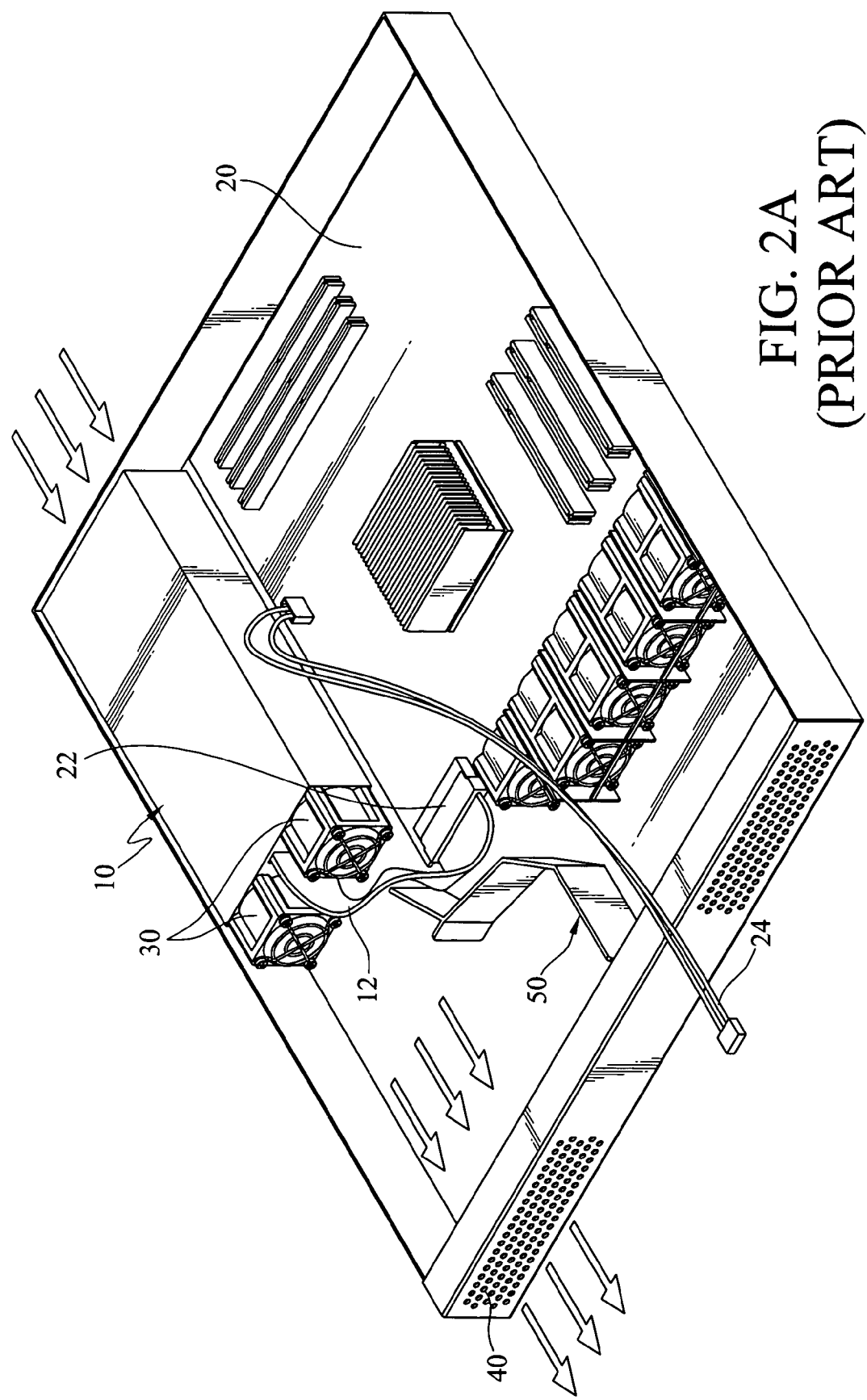
FIG. 2A is a schematic view of a first embodiment of a conventional wind fender for directing cooling air.
Figure 2B:
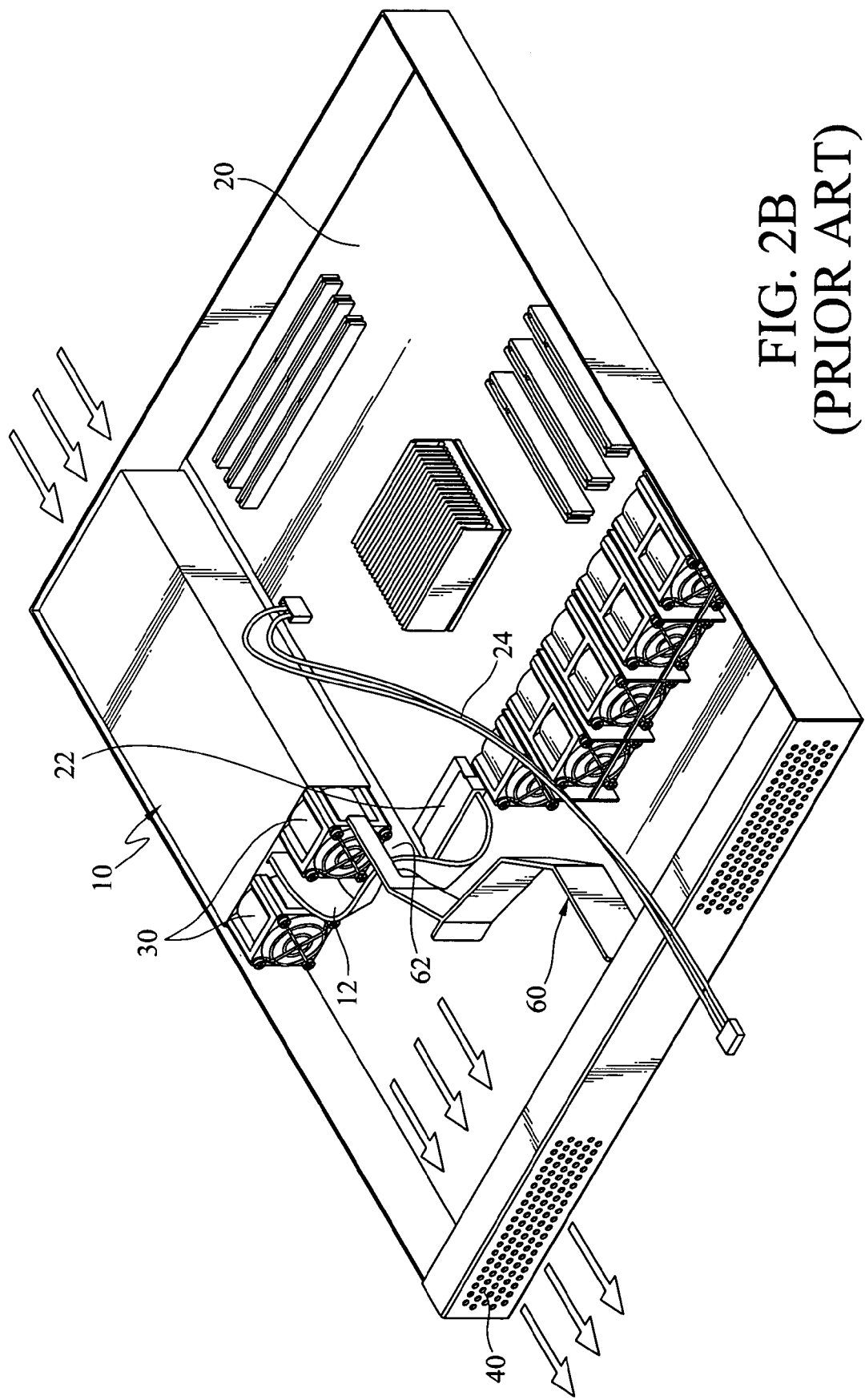
FIG. 2B is a schematic view of a second embodiment of a conventional wind fender for directing cooling air.
Figure 3:
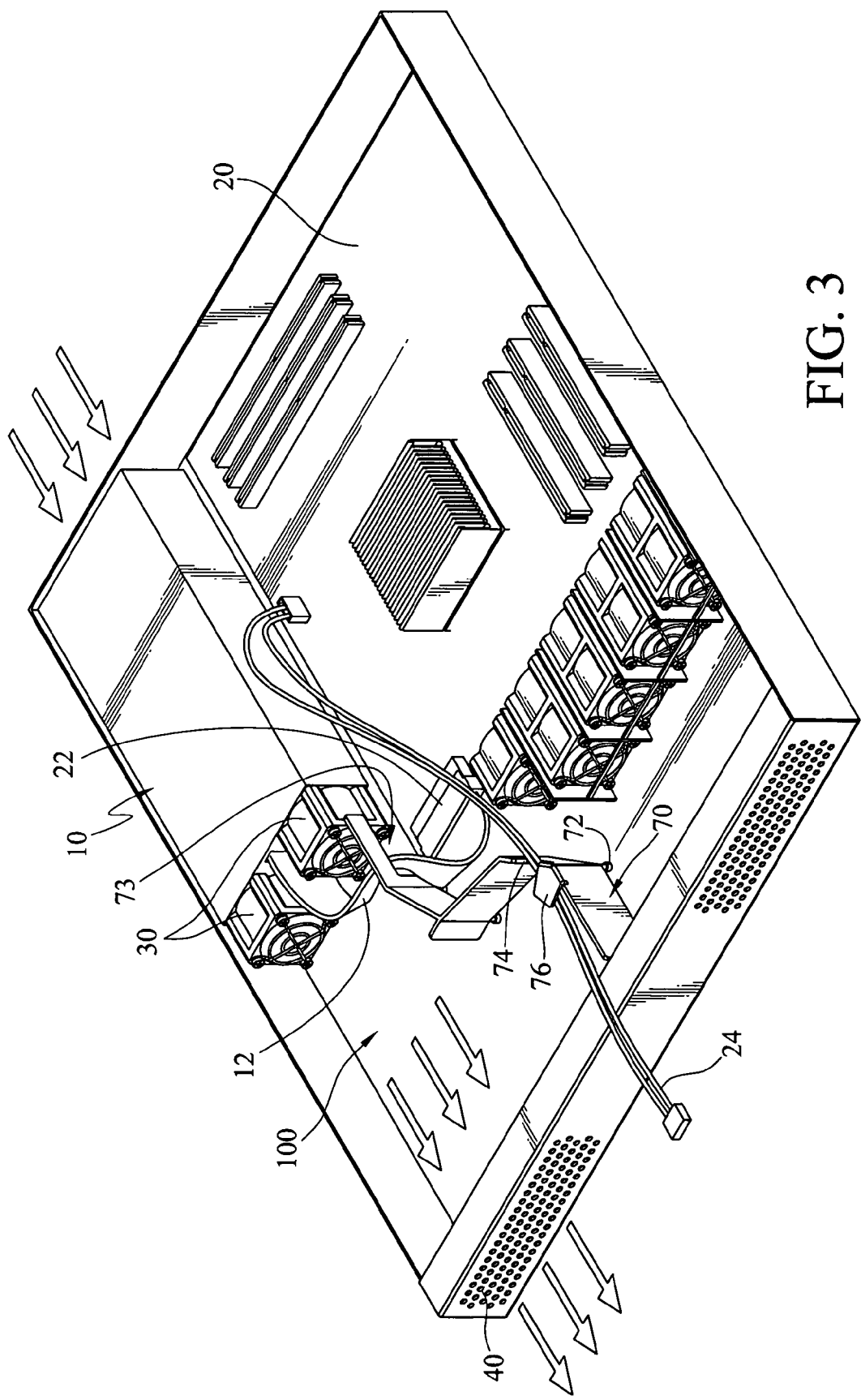
FIG. 3 is a schematic view of the invention in a use condition.

Refer to FIG. 3 for the invention in a use condition. The wind fender includes a wall 70, that includes a plurality of anchor sections 72 to install the wind fender on a case 100 that houses a mainboard 20 and a power supply 10, and a plurality of notches 74 to allow various cables on the mainboard to pass through without being hindered by the wind fender wall 70, and also to confine the movement of the cables along the X and Z axes. The wind fender further has a plurality of retaining sections 76 located on the wind fender wall 70 in a vertical manner to prevent the cables passing through the notches 74 from moving along the Y axis and straying from a preset wiring layout. The retaining sections are thus rigid.

The anchor sections 72 may be fixedly mounted onto the bottom of the case by latching, riveting or soldering. The case 100 has latch apertures corresponding to and engageable with the anchor sections 72 to install the wind fender.

The retaining sections 76 are located on the left side or right side of the wind fender wall 70 according to the wiring layout of the cables, and do not obstruct the notches 74. There is no limitation for the number and size of the notches 74 and retaining sections 76. They can be formed as desired as long as the cables can pass through without moving along the Y axis. The wind fender wall 70 may also have an aperture 73 to allow cables that do not have to be plugged and unplugged frequently to pass through. The cables may be a power cord 12 connecting to the power supply 10 or an audio wire 24 for connecting the mainboard 20 to a speaker.

There is no special restriction on the profile and size of the wind fender provided that it can direct the cooling air generated by an air fan 30 to the air vents 40.

By means of the aforesaid construction, heat may be confined in a selected area of the mainboard, and the wiring of the cables 12 and audio wire 24 can be confined in a desired location. Thus an optimal cooling effect may be achieved, and the configuration in the electronic device may become neat and tidy to make repairs and maintenance of the mainboard 20 easier.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A wind fender arrangement for a mainboard to confine and direct heat distribution on the mainboard and to maintain a wiring layout of a plurality of cables comprising:
    a case that contains the mainboard:
    a wind fender wall that is disposed inside of the case and is arranged to be essentially perpendicular to a bottom of the case, and being arranged to direct heat from a heat source to a vent opening in the case, the wall having at least one notch that restricts movement of the cables in a z-axis direction, and in an x-axis direction, the notch allowing the cables to pass through the wall without being hindered by the wind fender wall;
    at least one anchor section to anchor the wall on the case; and
    at least one retaining section located on the wall so as to be perpendicular therewith and parallel with the bottom of the case, to prevent the cables passing through the notch from moving in a y-axis direction and straying from a preset wiring layout.

2. The wind fender arrangement of claim 1, wherein the anchor section is fixedly installed on the bottom of the case by latching.

3. The wind fender arrangement of claim 1, wherein the case has at least one coupling aperture to engage with the anchor section.

4. The wind fender arrangement of claim 1, wherein the anchor section is fixedly installed on the case by riveting.

5. The wind fender arrangement of claim 1, wherein the anchor section is fixedly installed on the case by soldering.

6. The wind fender arrangement of claim 1, wherein the retaining section is located on one side of the wind fender according to the preset wiring layout of the cables.

7. The wind fender arrangement of claim 1, wherein the wind fender wall further has at least one aperture to allow the cables to pass through.

8. The wind fender arrangement of claim 1, wherein the cables are power cords to provide power supply.

9. The wind fender arrangement of claim 1, wherein the retaining section is rigid.

10. The wind fender arrangement of claim 1, wherein the mainboard is parallel to the bottom of the case.

* * * * *